US012347674B2

(12) United States Patent
Citla et al.

(10) Patent No.: US 12,347,674 B2
(45) Date of Patent: *Jul. 1, 2025

(54) DIRECTIONAL SELECTIVE DEPOSITION

(71) Applicant: Applied Materials, Inc., Santa Clara, CA (US)

(72) Inventors: Bhargav S. Citla, Fremont, CA (US); Soham Asrani, San Jose, CA (US); Joshua Rubnitz, Monte Sereno, CA (US); Srinivas D. Nemani, Saratoga, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/229,285

(22) Filed: Aug. 2, 2023

(65) Prior Publication Data

US 2023/0377875 A1 Nov. 23, 2023

Related U.S. Application Data

(63) Continuation of application No. 17/469,529, filed on Sep. 8, 2021, now Pat. No. 11,862,458.

(51) Int. Cl.
*H01L 21/02* (2006.01)
*H01J 37/32* (2006.01)
(Continued)

(52) U.S. Cl.
CPC .. *H01L 21/02274* (2013.01); *H01J 37/32146* (2013.01); *H01L 21/3065* (2013.01);
(Continued)

(58) Field of Classification Search
None
See application file for complete search history.

(56) References Cited

U.S. PATENT DOCUMENTS

| 6,846,745 B1 | 1/2005 | Papasouliotis et al. |
| 7,163,896 B1 | 1/2007 | Zhu et al. |

(Continued)

FOREIGN PATENT DOCUMENTS

| JP | 2011525682 A | 9/2011 |
| JP | 2019024080 A | 2/2019 |

(Continued)

OTHER PUBLICATIONS

Application No. PCT/US2022/042246, International Search Report and the Written Opinion, Mailed on Dec. 16, 2022, 10 pages.
(Continued)

*Primary Examiner* — Stephanie P Duclair
(74) *Attorney, Agent, or Firm* — Kilpatrick Townsend & Stockton LLP

(57) ABSTRACT

Exemplary processing methods may include forming a plasma of a silicon-containing precursor. The methods may include depositing a flowable film on a semiconductor substrate with plasma effluents of the silicon-containing precursor. The processing region may be at least partially defined between a faceplate and a substrate support on which the semiconductor substrate is seated. A bias power may be applied to the substrate support from a bias power source. The methods may include forming a plasma of a hydrogen-containing precursor within the processing region of the semiconductor processing chamber. The methods may include etching the flowable film from a sidewall of the feature within the semiconductor substrate with plasma effluents of the hydrogen-containing precursor. The methods may include densifying remaining flowable film within the feature defined within the semiconductor substrate with plasma effluents of the hydrogen-containing precursor.

12 Claims, 3 Drawing Sheets

(51) Int. Cl.
*H01L 21/3065* (2006.01)
*H01L 21/311* (2006.01)

(52) U.S. Cl.
CPC ... *H01L 21/31116* (2013.01); *H01J 2237/332* (2013.01); *H01J 2237/334* (2013.01)

(56) References Cited

U.S. PATENT DOCUMENTS

| | | |
|---|---|---|
| 8,264,154 B2 | 9/2012 | Banner et al. |
| 2009/0035915 A1 | 2/2009 | Su |
| 2009/0284156 A1 | 11/2009 | Banna et al. |
| 2011/0081782 A1 | 4/2011 | Liang et al. |
| 2013/0230987 A1 | 9/2013 | Draeger et al. |
| 2017/0062266 A1 | 3/2017 | Deng et al. |
| 2017/0162384 A1 | 6/2017 | Chen et al. |
| 2018/0330980 A1 | 11/2018 | Liang et al. |
| 2018/0350668 A1 | 12/2018 | Cheng et al. |
| 2021/0035854 A1 | 2/2021 | Yoo et al. |
| 2022/0020594 A1 | 1/2022 | Jiang et al. |
| 2023/0071366 A1 | 3/2023 | Citla et al. |
| 2024/0234131 A1 | 7/2024 | Modi et al. |
| 2025/0022704 A1 | 1/2025 | Ma et al. |

FOREIGN PATENT DOCUMENTS

| | | |
|---|---|---|
| JP | 2019192733 A | 10/2019 |
| JP | 2020516079 A | 5/2020 |
| JP | 2020520120 A | 7/2020 |
| KR | 20190129146 A | 11/2019 |

OTHER PUBLICATIONS

Office Action for JP2024-515345 mailed Feb. 17, 2025, 2 pages.
KR10-2024-7011224, "Office Action", Apr. 14, 2025, 10 pages.
PCT/US2025/015695, "International Search Report and Written Opinion", May 23, 2025, 12 pages.

DIRECTIONAL SELECTIVE DEPOSITION

CROSS-REFERENCE TO RELATED APPLICATIONS

This application is a continuation of U.S. application Ser. No. 17/469,529, filed Sep. 8, 2021, which is hereby incorporated by reference in its entirety for all purposes.

TECHNICAL FIELD

The present technology relates to semiconductor processing. More specifically, the present technology relates to methods of depositing, etching, and converting materials including flowable films.

BACKGROUND

Integrated circuits are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations a material may be formed or deposited to fill a trench or other feature formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature including between sidewalls within the feature, and may produce voids within the feature. This can impact device performance and subsequent processing operations.

Thus, there is a need for improved systems and methods that can be used to produce high quality devices and structures. These and other needs are addressed by the present technology.

SUMMARY

Exemplary processing methods may include forming a plasma of a silicon-containing precursor. The plasma of the silicon-containing precursor may be formed at a first power level from a plasma power source. The methods may include depositing a flowable film on a semiconductor substrate with plasma effluents of the silicon-containing precursor. The semiconductor substrate may be housed in a processing region of a semiconductor processing chamber. The semiconductor substrate may define a feature within the semiconductor substrate. The processing region may be at least partially defined between a faceplate and a substrate support on which the semiconductor substrate is seated. A bias power may be applied to the substrate support from a bias power source. The methods may include forming a plasma of a hydrogen-containing precursor within the processing region of the semiconductor processing chamber. The plasma of the hydrogen-containing precursor may be formed at a second power level from the plasma power source. A bias power may be applied to the substrate support from the bias power source at a third power level greater than the second power level. The methods may include etching and/or modifying the flowable film from a sidewall of the feature within the semiconductor substrate with plasma effluents of the hydrogen-containing precursor. The methods may include densifying remaining flowable film within the feature defined within the semiconductor substrate with plasma effluents of the hydrogen-containing precursor.

In some embodiments, the feature within the semiconductor substrate may be characterized by an aspect ratio of greater than or about 5:1. The feature may be characterized by a width across the feature of less than or about 10 nm. The bias power source may be operated in a pulsing mode at a pulsing frequency of less than or about 1 kHz during both the depositing and the etching. The plasma power source may be operated in a continuous wave mode while the bias power source is operated in the pulsing mode during the etching. The bias power source may be operated at a duty cycle of less than or about 50% during both the depositing and the etching. The bias power source may be engaged subsequent engagement of the plasma power source. The densifying may include reducing a hydrogen content of the flowable film to less than or about 30 at. %. The methods may include, subsequent to the densifying, forming a plasma of a conversion precursor. The methods may include converting the flowable film to a modified film. The conversion precursor may include a nitrogen-containing precursor, an oxygen-containing precursor, or a carbon-containing precursor. The method may be repeated in a second cycle. A temperature of the semiconductor substrate may be maintained at a temperature of less than or about 20° C. during the method.

Some embodiments of the present technology may encompass processing methods. The methods may include forming a plasma of a silicon-containing precursor. The plasma of the silicon-containing precursor may be formed at a first power level from a plasma power source. The methods may include depositing a flowable film on a semiconductor substrate with plasma effluents of the silicon-containing precursor. The semiconductor substrate may be housed in a processing region of a semiconductor processing chamber. The semiconductor substrate may define a feature within the semiconductor substrate. A bias power may be applied to a substrate support from a bias power source. The methods may include forming a plasma of a hydrogen-containing precursor within the processing region of the semiconductor processing chamber. The plasma of the hydrogen-containing precursor may be formed at a second power level for the plasma power source. A bias power may be applied from the bias power source to the plasma of the hydrogen-containing precursor at a third power level. The methods may include etching the flowable film from a sidewall of the feature defined within the semiconductor substrate with plasma effluents of the hydrogen-containing precursor. The methods may include densifying remaining flowable film within the feature defined within the semiconductor substrate with plasma effluents of the hydrogen-containing precursor.

In some embodiments, the plasma power source providing the second power level may be operated continuously while the bias power source is operated in a pulsing mode at a frequency of less than or about 1 kHz during the etching. The bias power source may be operated at a duty cycle of less than or about 25% during each of the depositing and the etching. The etching may fully remove the flowable film from the sidewall of the feature above a base fill of the feature. The methods may include, subsequent to the densifying, forming a plasma of a conversion precursor. The methods may include converting the flowable film to a modified film. The conversion precursor may include a nitrogen-containing precursor, an oxygen-containing precursor, or a carbon-containing precursor. The modified film may be or include silicon nitride, silicon oxide, or silicon carbide.

Some embodiments of the present technology may encompass processing methods. The methods may include forming a plasma of a silicon-containing precursor utilizing a pulsed source power and a pulsed bias power. The methods may include depositing a flowable film on a semiconductor substrate with plasma effluents of the silicon-containing precursor. The semiconductor substrate may be housed in a processing region of a semiconductor processing chamber. The semiconductor substrate may define a feature within the semiconductor substrate. The methods may include forming a plasma of a hydrogen-containing precursor within the processing region of the semiconductor processing chamber utilizing a pulsed source power and a pulsed bias power. The methods may include etching the flowable film from a sidewall of the feature defined within the semiconductor substrate with plasma effluents of the hydrogen-containing precursor. The methods may include densifying remaining flowable film within the feature defined within the semiconductor substrate with plasma effluents of the hydrogen-containing precursor. The methods may include forming a plasma of a conversion precursor. The methods may include converting the flowable film to a modified film. In some embodiments, the modified film may be or include silicon and one or more of nitrogen, oxygen, or carbon.

Such technology may provide numerous benefits over conventional systems and techniques. For example, by performing a treatment during deposition, a quality of material produced within features from the bottom may improve, which may differentiate the quality from material on the sidewalls. Additionally, by performing an etch operation according to embodiments of the present technology, sidewall coverage can be etched selectively relative to the higher quality, treated material. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
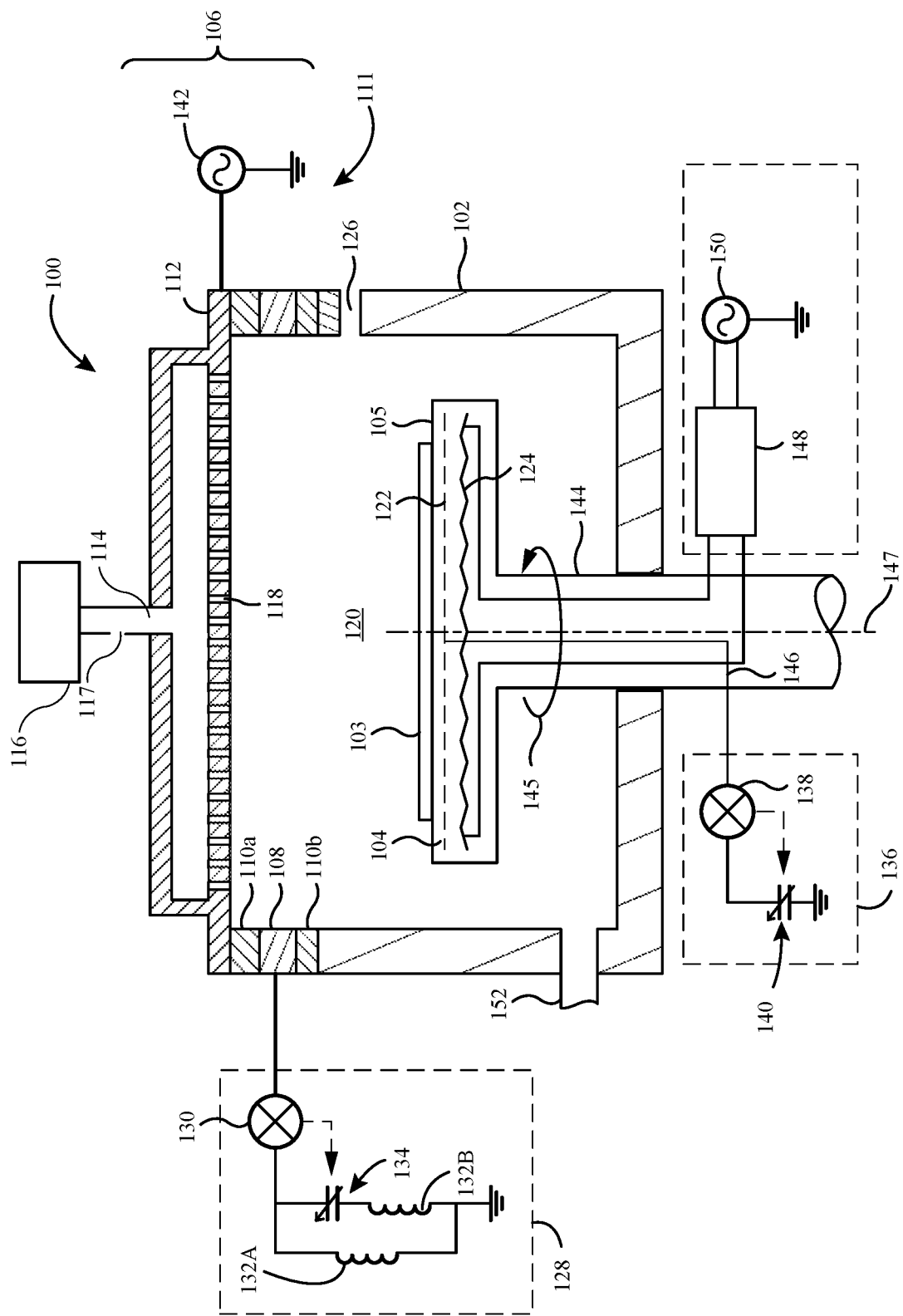
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Amorphous silicon may be used in semiconductor device manufacturing for a number of structures and processes, including as a sacrificial material, for example as a dummy gate material, or as a trench fill material. In gap filling operations, some processing may utilize flowable films formed under process conditions to limit conformality of deposition, which may allow the deposited material to better fill features on the substrate. Flowable silicon material may be characterized by relatively high amounts of hydrogen, and may be less dense than other formed films. Consequently, subsequent treatment operations may be performed to cure the produced films. Conventional technology may utilize a UV curing process to remove hydrogen and process the film. However, UV curing may result in significant film shrinkage, which may cause stress on features as well as produce voids within the structure.

As feature sizes continue to shrink, flowable films may be challenged for narrow features, which may be further characterized by higher aspect ratios. For example, pinching of the feature may more readily occur due to deposition on sidewalls of the feature, which in small feature sizes may further restrict flow further into the feature, and may produce voids. Additionally, for processes in which conversion of the amorphous silicon may be performed, expansion of the sidewall materials during conversion may further restrict access within the feature. The present technology may overcome these limitations by performing a directional treatment of material formed in the feature that may not be performed on material deposited on the sidewalls. Additionally, the present technology may perform a selective etch and/or modification of the formed film during a curing operation that is capable of removing the lower quality material on the sidewalls, while maintaining denser material within the feature. This may limit or prevent sidewall coverage during trench fill, allowing improved fill operations to be performed. Additionally, conversion operations may be performed subsequent curing, which may further reduce flow restriction within the feature. After describing general aspects of a chamber according to some embodiments of the present technology in which plasma processing operations discussed below may be performed, specific methodology may be discussed. It is to be understood that the present technology is not intended to be limited to the specific films, chambers, or processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more deposition or other processing operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Inlet 114 may include delivery from a remote plasma source unit 116, which may be fluidly coupled with the chamber, as well as a bypass 117 for process gas delivery that may not flow through the remote plasma source unit 116 in some embodiments. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
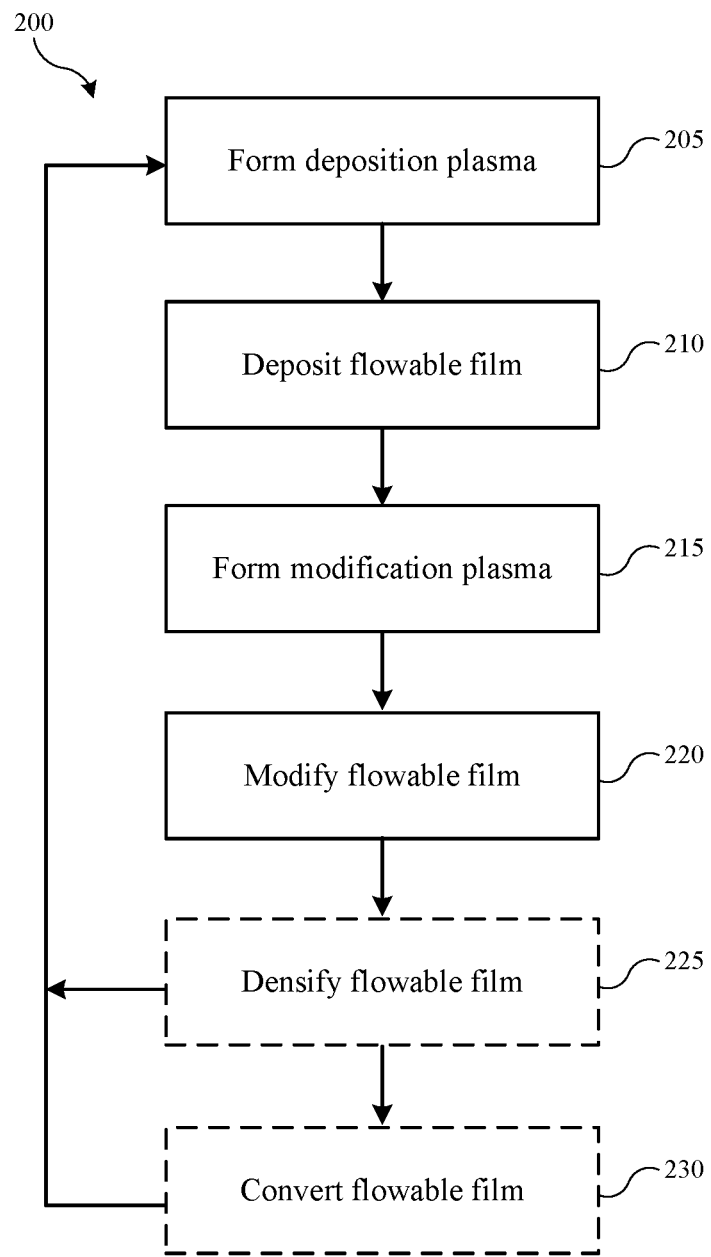
FIG. 2 shows exemplary operations in a processing method according to some embodiments of the present technology.

Processing chamber 100 may be utilized in some embodiments of the present technology for processing methods that may include formation, treatment, etching, or conversion of materials for semiconductor structures. It is to be understood that the chamber described is not to be considered limiting, and any chamber that may be configured to perform operations as described may be similarly used. FIG. 2 shows exemplary operations in a processing method 200 according to some embodiments of the present technology. The method may be performed in a variety of processing chambers and on one or more mainframes or tools, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3A-3C, the illustrations of which will be described in conjunction with the operations of method 200. It is to be understood that the figures illustrate only partial schematic views, and a substrate may contain any number of additional materials and features having a variety of characteristics and aspects as illustrated in the figures.

Method 200 may include additional operations prior to initiation of the listed operations. For example, additional processing operations may include forming structures on a semiconductor substrate, which may include both forming and removing material. For example, transistor structures, memory structures, or any other structures may be formed. Prior processing operations may be performed in the chamber in which method 200 may be performed, or processing may be performed in one or more other processing chambers prior to delivering the substrate into the semiconductor processing chamber or chambers in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

A substrate on which several operations have been performed may be substrate 305 of a structure 300, which may show a partial view of a substrate on which semiconductor processing may be performed. It is to be understood that structure 300 may show only a few top layers during processing to illustrate aspects of the present technology. The substrate 305 may include a material in which one or more features 310 may be formed. Substrate 305 may be any number of materials used in semiconductor processing. The substrate material may be or include silicon, germanium, dielectric materials including silicon oxide or silicon nitride, metal materials, or any number of combinations of these materials, which may be the substrate 305, or materials formed in structure 300. Features 310 may be characterized by any shape or configuration according to the present technology. In some embodiments, the features may be or include a trench structure or aperture formed within the substrate 305.

Although the features 310 may be characterized by any shapes or sizes, in some embodiments the features 310 may be characterized by higher aspect ratios, or a ratio of a depth of the feature to a width across the feature. For example, in some embodiments features 310 may be characterized by aspect ratios greater than or about 5:1, and may be characterized by aspect ratios greater than or about 10:1, greater than or about 15:1, greater than or about 20:1, greater than or about 25:1, greater than or about 30:1, greater than or about 40:1, greater than or about 50:1, or greater. Additionally, the features may be characterized by narrow widths or diameters across the feature including between two sidewalls, such as a dimension less than or about 20 nm, and may be characterized by a width across the feature of less than or about 15 nm, less than or about 12 nm, less than or about 10 nm, less than or about 9 nm, less than or about 8 nm, less than or about 7 nm, less than or about 6 nm, less than or about 5 nm, or less.

In some embodiments, method 200 may include optional treatment operations, such as a pretreatment, that may be performed to prepare a surface of substrate 305 for deposition. Once prepared, method 200 may include delivering one or more precursors to a processing region of the semiconductor processing chamber housing the structure 300. The precursors may include one or more silicon-containing precursors, as well as one or more diluents or carrier gases such as an inert gas or other gas delivered with the silicon-containing precursor. A plasma may be formed of the deposition precursors including the silicon-containing precursor at operation 205. The plasma may be formed within the processing region, which may allow deposition materials to deposit on the substrate. For example, in some embodiments a capacitively-coupled plasma may be formed within the processing region by applying plasma power to the faceplate as previously described.

Figure 3A:
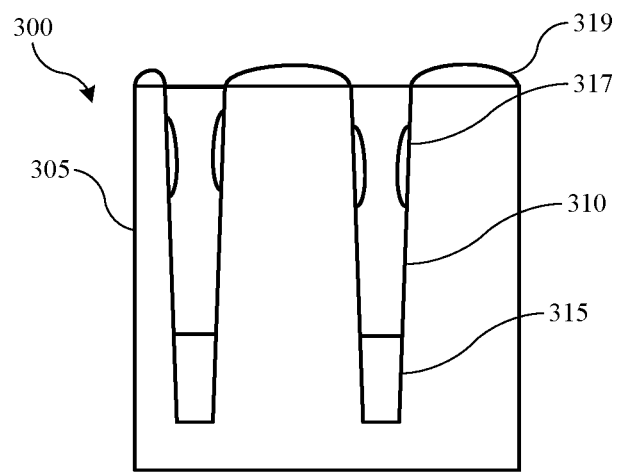
FIGS. 3A-3C show schematic cross-sectional views of a substrate during a processing according to some embodiments of the present technology.

A silicon-containing material may be deposited on the substrate at operation 210 from plasma effluents of the silicon-containing precursor. The material may be a flowable silicon-containing material in some embodiments, which may be or include amorphous silicon. The deposited materials may at least partially flow into the features on the substrate to provide a bottom-up type of gap fill. As illustrated in FIG. 3A, material 315 may be deposited on the substrate 305, and may flow into trenches or features 310. As illustrated, the deposited material 315 may flow into the bottom of the feature, although an amount of material may remain on the sidewalls of the substrate as illustrated with material 317, as well as material on top of, or between, features, as illustrated with material 319. Although the amount deposited may be relatively small, the remaining material on the sidewalls may limit subsequent flow. Additionally, if a conventional conversion were performed of the deposited material, such as a conversion to silicon nitride for example, the conversion would involve an expansion of the film. For reduced dimension features, the residual material formed on the sidewalls may be converted and expand outward towards an opposite sidewall. This may cause the feature to be pinched off, which may form voids within the feature.

The power applied during deposition may be a lower power plasma, which may limit dissociation, and which may maintain an amount of hydrogen incorporation in the deposited materials. This incorporated hydrogen may contribute to the flowability of the materials deposited. Additionally, unlike conventional technologies, the present technology may incorporate a bias process, which may produce a treatment to the deposited film during the deposition operations. The process may include utilizing a source power, such as coupled with the faceplate or showerhead as previously described, as well as utilizing a bias power, such as applied through the substrate support as discussed above. The source power may be used to perform a controlled dissociation of the silicon-containing precursor, which may limit dissociation and allow longer material chains to be formed. When these materials contact the substrate, the longer chain silicon-containing materials may have increased flowability, which may improve bottom-up fill.

The source power may be pulsed, and the duty cycle may be reduced, which may further reduce the effective plasma power in some embodiments. For example, the source power may be applied at any higher frequency, such as greater than or about 10 MHz, greater than or about 13 MHz, greater than or about 15 MHz, greater than or about 20 MHz, or higher. The plasma power source may deliver a plasma power to the faceplate of less than or about 300 W, and may deliver a power of less than or about 250 W, less than or about 200 W, less than or about 150 W, less than or about 100 W, less than or about 50 W, or less. Additionally, the source power may be pulsed at a pulsing frequency of 20 kHz or less, such as less than or about 15 kHz, less than or about 12 kHz, less than or about 10 kHz, less than or about 8 kHz, or less. Additionally, the pulsing duty cycle may be applied at less than or about 50%, and may be applied at less than or about 40%, less than or about 30%, less than or about 20%, less than or about 10%, less than or about 5%, less than or about 1% or less. This may limit the silicon precursor dissociation, and improve long-chain formation.

In some embodiments, to facilitate dissociation and deposition, the deposition precursors may include one or more inert gases, such as argon and/or helium, which may help improve dissociation. Additionally, in some embodiments the deposition precursors may include diatomic hydrogen, which may be flowed to facilitate a treatment process during the deposition, and which may be aided by the bias power provision. For example, hydrogen may be delivered with the silicon-containing precursor at a flow rate ratio of the hydrogen to the silicon-containing precursor of greater than or about 0.5:1, and may be delivered at a flow rate ratio of greater than or about 1:1, greater than or about 1.5:1, greater than or about 2:1, greater than or about 2.5:1, greater than or about 3.0:1, greater than or about 3.5:1, greater than or about 4.0:1, or more.

The hydrogen may also be dissociated in the plasma generated, and may be further activated by utilizing a bias power delivery. For example, in some embodiments, a bias power source may be operated at a lower frequency than the source power, and may be operated at less than or about 10 MHz, less than or about 5 MHz, less than or about 2 MHz, or less. The power supply may be operated at a power of less than or about 500 W, and may be operated at less than or about 450 W, less than or about 400 W, less than or about 350 W, or less. The bias power may create an amount of directionality of effluent movement, and may allow lighter hydrogen radicals to further dissociate argon and/or helium, which may be directed more specifically downward at the structure. The lower frequency power may also impart additional energy to the ions as they travel in more straight-line paths down to the substrate.

Figure 3B:
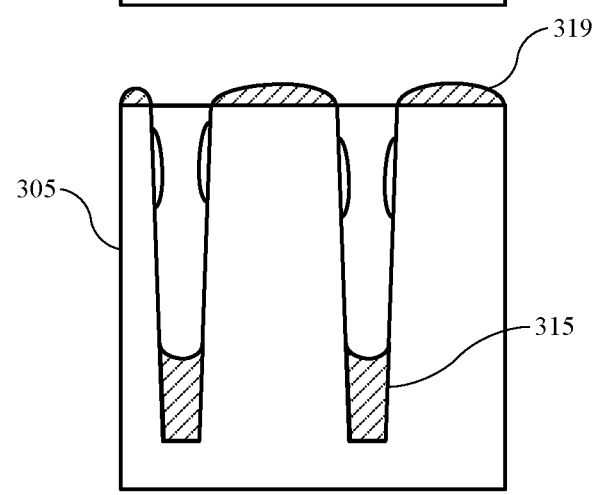

These hydrogen and inert gas radical species may transfer energy to materials along surfaces normal to the direction of travel, such as material along the bottom of features and along the top of features, such as material 315 and 319. The energy may help release excess hydrogen, which may densify the film in these locations. As illustrated in FIG. 3B, while the material 317 along the sidewalls may not be impacted, or may have limited changes, the material 315 and 319 may be densified, which may improve the quality of the materials. Consequently, in some embodiments, material along the top and bottom of the structure may be characterized by a higher quality, which may include an increased density, over material that may have deposited along sidewalls of the features.

However, by utilizing a bias power, the deposition plasma may be characterized by an increased power, which may further dissociate the silicon-containing precursor and reduce flowability. Accordingly, to limit this effect, the bias power may also be pulsed at a pulsing frequency of less than or about 10 kHz, and may be pulsed at a frequency of less than or about 5 kHz, less than or about 1 kHz, less than or about 500 Hz, less than or about 100 Hz, less than or about 50 Hz, less than or about 10 Hz, or less. Additionally, the duty cycle may be operated at less than or about 50%, and may be operated at less than or about 40%, less than or about 30%, less than or about 20%, less than or about 10%, less than or about 5%, or about 1%, which may further reduce the impact of the bias power. By operating the bias power at very low pulsing frequency and duty cycle, the bias power may be utilized to increase film quality at the top of the structure and at the bottom of the feature, while limiting an impact on any other deposition characteristics. Additionally, by utilizing a low power, the hydrogen may not be energized sufficiently to cause etching of the deposited material, or lead to sputtering of the material based on bombardment of the inert gas effluents.

Subsequent an amount of deposition, in some embodiments of the present technology an etching and/or modifying process may be performed that is configured to etch back the formed material selectively and modifying the remaining material. This process may be performed in the same chamber as the deposition, and may be performed in a cyclic process to fill the feature. In some embodiments the silicon-containing precursor flow may be halted and the processing region may be purged. The flow of inert gases, such as argon and/or helium, may also be halted. Subsequent a purge, a hydrogen-containing precursor may be flowed into the processing region of the processing chamber. In some embodiments, the modification process may only include a hydrogen-containing precursor, which may be diatomic hydrogen in some embodiments. A modification plasma may be formed at operation 215, which may also be a capacitively-coupled plasma formed within the processing region, although in some embodiments an inductively-coupled plasma may similarly be applied.

Similarly to the deposition process, during the etching operation, an additional power source may be engaged and coupled with the substrate support as previously described to provide a bias to the plasma generated above the substrate. Accordingly, the etch process may also include both source power and bias power. This may draw plasma effluents to the substrate, which may bombard the film and cause densification of the deposited materials, especially the materials that have already been at least partially improved by the treatment performed during deposition. Although any hydrogen-containing material may be used, in some embodiments diatomic hydrogen may be used as the hydrogen-containing precursor to produce the etching plasma. The hydrogen radicals and ions may readily penetrate the materials formed within the trench, and may release incorporated hydrogen from the film causing densification. The bias power applied may be relatively low to limit sputtering of the produced film as well as to limit any potential damage to the structure. Additionally, by adjusting the source power and the bias power applied, an etching operation may be performed, which may reduce sidewall coverage of the deposited material while limiting an effect on the previously treated materials.

Diatomic hydrogen, or any other hydrogen-containing material, may be utilized to generate a plasma within the processing region by delivering power to the faceplate from the plasma power source. The plasma power in some embodiments may be greater than a plasma power used during the deposition, both from the source power and the bias power. For example, the plasma source power delivered may be greater than or about 100 W, and may be greater than or about 200 W, greater than or about 300 W, greater than or about 400 W, greater than or about 500 W, or more. By increasing the plasma power during the treatment plasma formation, a greater amount of plasma effluents may be generated. However, as plasma power increases, the amount of material etched from the bottom of the structure may also increase. Accordingly, in some embodiments the plasma source power may be maintained at less than or about 500 W, and may be maintained at less than or about 400 W, less than or about 300 W, or less. Additionally, aspects of the bias power may also be adjusted. For example, in some treatment operations the bias power may be higher than the plasma source power, which may provide enough power to the plasma to ensure etching of lower quality materials occurs, such as materials along the sidewalls that may not have been treated during the deposition operation.

Figure 3C:
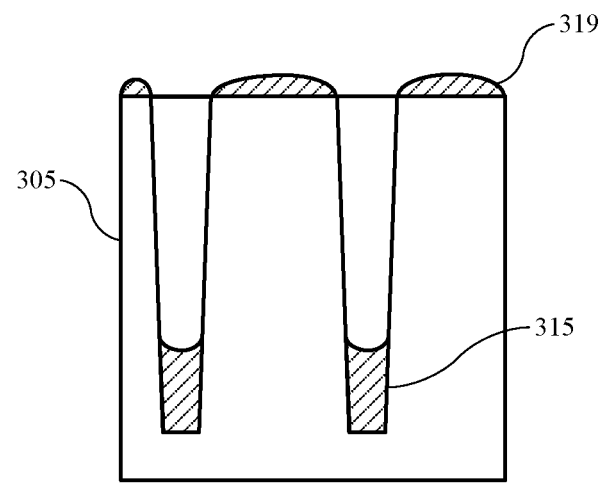

Applying greater bias power may increase an ability of the hydrogen to etch deposited materials. While the bias power during deposition may be reduced to limit an etching effect, during the modification operation a bias power, which may be at any of the frequencies noted above, may be increased to greater than or about 500 W, and may be increased to greater than or about 800 W, greater than or about 1000 W, greater than or about 1200 W, greater than or about 1400 W, greater than or about 1600 W, greater than or about 1800 W, or more. However, because the bias power may impart directionality, the bias power may be pulsed as discussed below, which may provide etching of the lower quality material, while maintaining the material previously treated, and which may modify and/or densify the material. The plasma effluents may then etch the flowable film at operation 220, and may remove the flowable film from the sidewalls of the trench. Simultaneously, and beneficially, plasma effluents delivered more directionally may penetrate the remaining film formed at the bottom of the feature, and may reduce hydrogen incorporation to densify the film at optional operation 225. As illustrated in FIG. 3C, material 317 may be removed from sidewalls and overhang regions of the substrate 305, which may maintain the deposited material at bottom regions of the feature and along the top region of the structure. As an added benefit, the densified material 319 at the top of the structure may also protect the underlying material from damage by limiting any impact on the materials. The process may also provide a reduced hydrogen incorporation in the remaining material, such as a hydrogen incorporation of less than or about 40 at. %, and may provide a reduced hydrogen incorporation of less than or about 35 at. %, less than or about 30 at. %, less than or about 25 at. %, less than or about 20 at. %, less than or about 15 at. %, less than or about. %, less than or about 5 at. %, or less.

Additional adjustments may be made to further increase etching of deposited material along sidewalls of the features by adjusting one or more characteristics of the plasma power or bias power being supplied. For example, in some embodiments both the plasma power source and bias power source may be operated in a continuous wave mode. Additionally, one or both of the power sources may be operated in a pulsed mode. In some embodiments, the source power may be operated in a continuous wave mode while the bias power is operated in a pulsed mode. A pulsing frequency for the bias power may be any of the pulsing frequencies discussed previously. The duty cycle of the bias power may be less than or about 75%, and the bias power may be operated at a duty cycle of less than or about 70%, less than or about 60%, less than or about 50%, less than or about 40%, less than or about 30%, less than or about 20%, less than or about 10%, less than or about 5%, or less. By operating the bias power for a reduced duty cycle, such as an on-time duty of less than or about 50%, a greater amount of time per cycle may be performing a more isotropic etch within the feature, such as during the off time, which may better remove material from the sidewalls.

Additional power configurations may also include an amount of synchronization of the source power and the bias power in a master/slave relationship. For example, both power supplies may be operated in a pulsing orientation, and the bias power may be synchronized to engage after the source power has been engaged at each pulse. A level-to-level pulsing scheme may also be applied. For example, during the on duty of the bias power, the source power may be operated at a first plasma power. During the remainder of the cycle where the bias power is off, the source power may be operated at a second plasma power, which may be greater than the first plasma power. This may both increase isotropic etching by removing the bias-induced directionality, and may also increase etching characteristics of the isotropic etch. The deposition and etch processes may be repeated any number of times in cycles to fill a feature in embodiments of the present technology, which may fill a feature with amorphous silicon.

Additionally, in some embodiments where the silicon may be sought to be converted within the feature, the cycling may also include a conversion operation. By converting during each cycle, penetration issues through the feature may be fully resolved. Also, by performing a conversion operation subsequent to the curing and etching/modification, deposited material may be removed from the sidewalls prior to conversion, which may limit film expansion laterally within the trench or feature between sidewalls as previously described. The conversion may be performed in a different chamber from the deposition and treatment, although in some embodiments two or more, including all operations, may be performed within a single processing chamber. This may reduce queue times over conventional processes.

Method 200 may also optionally include conversion of the amorphous silicon to another material. For example, subsequent to the etching and densifying, one or more conversion precursors may be delivered to the processing region of the chamber. For example, a nitrogen-containing precursor, an oxygen-containing precursor, and/or a carbon-containing precursor may be delivered to the processing region of the chamber, along with any carrier or diluent gases. A plasma may be formed of the conversion precursor, which may then contact the amorphous silicon material within the feature. At optional operation 230, plasma effluents of the conversion precursor may interact with the amorphous silicon material within the trench, and convert the material to silicon nitride, silicon oxide, silicon carbide, silicon oxynitride, silicon oxycarbide, silicon carbon nitride, or silicon oxycarbonitride, along with any other materials that may be used to convert amorphous silicon films. The plasma power may be similar to powers previously stated, and may be from about 100 W up to about 1,000 W or more for a capacitively-coupled system, as well as up to 10 kW or more for an inductively-coupled plasma system, for example, although any type of conversion may also be performed.

Although the deposition may be formed to several nanometers or more, by performing an etch process as previously described, the thickness of densified material may be controlled to be at a thickness of less than or about 500 Å, and may be less than or about 450 Å, less than or about 400 Å, less than or about 350 Å, less than or about 300 Å, less than or about 250 Å, less than or about 200 Å, less than or about 150 Å, less than or about 100 Å, less than or about 50 Å, or less. By controlling the thickness of the deposited material, conversion through the entire thickness may be performed more readily, and penetration issues common in conventional processes may be resolved. After a conversion of deposited material, the process may then be fully repeated to continue to produce the converted material up through the feature.

Any number of precursors may be used with the present technology with regard to the deposition precursors used during any of the formation operations. Silicon-containing precursors that may be used during any silicon formation, silicon oxide formation, or silicon nitride formation may include, but are not limited to, silane ($SiH_4$), disilane ($Si_2H_6$), trisilane, or other organosilanes including cyclohexasilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-containing film formation. By utilizing higher order silanes, longer material chains may be produced, which may increase flowability in some embodiments. The silicon-containing material may be nitrogen-free, oxygen-free, and/or carbon-free in some embodiments. Oxygen-containing precursors used in any operation as described throughout the present technology may include $O_2$, $N_2O$, $NO_2$, $O_3$, $H_2O$, as well as any other oxygen-containing precursors that may be used in silicon oxide film formation, or other film formation. Nitrogen-containing precursors used in any operation may include $N_2$, $N_2O$, $NO_2$, $NH_3$, $N_2H_2$, as well as any other nitrogen-containing precursor that may be used in silicon nitride film formation. Carbon-containing precursors may be or include any carbon-containing material, such as any hydrocarbon, or any other precursor including carbon. In any of the operations one or more additional precursors may be included, such as inert precursors, which may include Ar, He, Xe, Kr, or other materials such as nitrogen, ammonia, hydrogen, or other precursors.

Temperature and pressure may also impact operations of the present technology. For example, in some embodiments to facilitate film flow, the process may be performed at a temperature below or about 20° C., and may be performed at a temperature less than or about 0° C., less than or about −20° C., less than or about −50° C., less than or about −75° C., less than or about −100° C., or lower. The temperature may be maintained in any of these ranges throughout the method, including during the treatment and etching, as well as the conversion. Pressure within the chamber may be kept relatively low for any of the processes as well, such as at a chamber pressure of less than or about 20 Torr, and pressure may be maintained at less than or about 15 Torr, less than or about 10 Torr, less than or about 5 Torr, less than or about 3 Torr, less than or about 2 Torr, less than or about 1 Torr, less than or about 0.1 Torr, or less. By performing processes according to some embodiments of the present technology, improved fill of narrow features utilizing silicon-containing materials may be produced.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a plasma of a silicon-containing precursor, wherein the plasma of the silicon-containing precursor is formed at a first power level from a plasma power source, and wherein the silicon-containing precursor comprises silane ($SiH_4$), disilane ($Si_2H_6$), trisilane ($Si_3H_8$), silicon tetrafluoride ($SiF_4$), silicon tetrachloride ($SiCl_4$), dichlorosilane ($SiH_2Cl_2$), or tetraethyl orthosilicate (TEOS);
   depositing a film on a semiconductor substrate with plasma effluents of the silicon-containing precursor, wherein the film comprises amorphous silicon, wherein the semiconductor substrate is housed in a processing region of a semiconductor processing chamber, wherein the semiconductor substrate defines a feature within the semiconductor substrate, wherein the processing region is at least partially defined between a faceplate and a substrate support on which the semiconductor substrate is seated, and wherein a bias power is applied to the substrate support from a bias power source;
   forming a plasma of a hydrogen-containing precursor within the processing region of the semiconductor processing chamber, wherein the plasma of the hydrogen-containing precursor is formed at a second power level from the plasma power source, and wherein a bias power is applied to the substrate support from the bias power source at a third power level greater than the second power level; and
   etching the film from a sidewall of the feature within the semiconductor substrate with plasma effluents of the hydrogen-containing precursor.

2. The semiconductor processing method of claim 1, wherein the feature within the semiconductor substrate is characterized by an aspect ratio of greater than or about 5:1, and wherein the feature is characterized by a width across the feature of less than or about 10 nm.

3. The semiconductor processing method of claim 1, wherein the bias power source is operated in a pulsing mode at a pulsing frequency of less than or about 1 kHz during both the depositing and the etching.

4. The semiconductor processing method of claim 3, wherein the plasma power source is operated in a continuous wave mode while the bias power source is operated in the pulsing mode during the etching.

5. The semiconductor processing method of claim 3, wherein the bias power source is operated at a duty cycle of less than or about 50% during both the depositing and the etching.

6. The semiconductor processing method of claim 1, further comprising:
   densifying the film during depositing, during etching, or both, wherein the densifying comprises reducing a hydrogen content of the film to less than or about 30 at. %.

7. The semiconductor processing method of claim 1, further comprising:
   subsequent to the etching, forming a plasma of a conversion precursor; and
   converting the film to a modified film.

8. The semiconductor processing method of claim 7, wherein the conversion precursor comprises a nitrogen-containing precursor, an oxygen-containing precursor, or a carbon-containing precursor.

9. The semiconductor processing method of claim 8, wherein the nitrogen-containing precursor comprises diatomic nitrogen ($N_2$), nitrous oxide ($N_2O$), nitrogen dioxide ($NO_2$), ammonia ($NH_3$), or diimide ($N_2H_2$).

10. The semiconductor processing method of claim 8, wherein the oxygen-containing precursor comprises diatomic oxygen ($O_2$), nitrous oxide ($N_2O$), nitrogen dioxide ($NO_2$), ozone ($O_3$), or steam ($H_2O$).

11. A semiconductor processing method comprising:
    forming a plasma of one or more precursors, wherein the one or more precursors comprise at least one of a carbon-containing precursor, a nitrogen-containing precursor, an oxygen-containing precursor, and a silicon-containing precursor;
    depositing a film on a semiconductor substrate with plasma effluents of the one or more precursors, wherein the semiconductor substrate is housed in a processing region of a semiconductor processing chamber, wherein the semiconductor substrate defines a feature within the semiconductor substrate, and wherein the processing region is at least partially defined between a faceplate and a substrate support on which the semiconductor substrate is seated;
    forming a plasma of an etchant precursor within the processing region of the semiconductor processing chamber while applying a bias power to the substrate support from a bias power source;
    etching the film from a sidewall of the feature within the semiconductor substrate with plasma effluents of the etchant precursor to provide a remaining portion of the film; and
    converting the remaining portion of the film to provide a converted film.

12. The semiconductor processing method of claim 11, wherein:
    the carbon-containing precursor comprises a hydrocarbon;
    the nitrogen-containing precursor comprises diatomic nitrogen (N2), nitrous oxide (N2O), nitrogen dioxide (NO2), ammonia (NH3), or diimide (N2H2);
    the oxygen-containing precursor comprises diatomic oxygen (O2), nitrous oxide (N2O), nitrogen dioxide (NO2), ozone (O3), or steam (H2O); and
    the silicon-containing precursor comprises silane (SiH4), disilane (Si2H6), trisilane (Si3H8), silicon tetrafluoride (SiF4), silicon tetrachloride (SiCl4), dichlorosilane (SiH2Cl2), or tetraethyl orthosilicate (TEOS).

\* \* \* \* \*